Dec. 20, 1966 J. B. GUNN 3,293,092

SEMICONDUCTOR DEVICE FABRICATION

Filed March 17, 1964

INVENTOR
JOHN B. GUNN

BY John F. Ahlandt Jr.
ATTORNEY 3,293,092

SEMICONDUCTOR DEVICE FABRICATION

John B. Gunn, Yorktown Heights, N.Y., assignor to International Business Machines Corporation, New York, N.Y., a corporation of New York Filed Mar. 17, 1964, Ser. No. 352,501
6 Claims. (Cl. 156—17)

Figure 1:
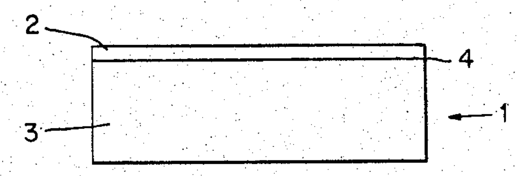

This invention relates to a method of making a semiconductor device and more particularly to a technique of making a connection to a semiconductor body, including the formation of a junction whereby the connection made is mechanically strong and the junction area formed is extremely small.

This application is a continuation-in-part of application Ser. No. 79,856, now abandoned, of the same inventor, and assigned to the same assignee.

It has become highly desirable in the fabrication of certain semiconductor devices, particularly in making Esaki diodes, that the junction be of very small area. This is for the reason that when it is desired to operate these devices at high frequencies, the peak current densities involved are extremely high and, in order to properly limit the peak current, the junction area of necessity must be small.

There are certain well known techniques for making rectifying connections to a semiconductor body and, in accordance with these techniques, the semiconductor body is suitably etched after an alloying step has been completed. One example of these techniques is shown in the J. R. A. Beale U.S. Patent 2,878,147, issued Mar. 17, 1959, wherein there is disclosed a method involving the diffusion of an impurity vapor such as antimony into a semiconductor body so as to create an opposite conductivity layer or region therein. A dot of solder is then placed on top of the opposite conductivity layer and the crystal structure is etched in a hydrogen peroxide bath with the result that, while the solder dot is not affected, the crystalline body is etched away so that the opposite conductivity layer, except for the portion underlying the dot, is removed.

Although the technique of Beale Patent 2,878,147 is effective to provide a reasonably sound connection to the body, it is not efficacious for producing concomitantly a very small area junction. If the attempt were made to achieve such a junction by extending the etching step, although the etchant would proceed to etch away a portion underlying the solder dot, the etchant would at the same time etch away downwardly. The result would be a small area junction but with an undesirably long stalk, that is to say, a long piece of semiconductor material between the main portion of the body and the solder dot, whereby a mechanically unsound connection would result.

Accordingly, it is an object of the present invention to provide a very small area junction in semiconductor devices where the connection to the semiconductor body via said junction is at the same time mechanically rugged.

Another object is to obtain a semiconductor device wherein the connection to the main region of the body is limited to an extremely small length.

The above objects are realized with the technique of the present invention by initially depositing an entirely different semiconductor material on a substrate of a given semiconductor material. The deposition is achieved in accordance with a vapor growth process previously described in G. A. Silvey copending application Ser. No. 59,004, filed Sep. 28, 1960 and assigned to the assignee of the present invention. As an example, gallium arsenide can be grown onto a substrate of germanium. By reason of the fact that an entirely different material then exists in a thin layer on top of the semiconductor body, the different material may be etched away selectively by a suitable etchant chosen so that the main region of the body is totally uneffected by the etchant or is effected more slowly than the different material. The result, therefore, is that an automatic stop is effected downwardly, but the etching will continue under the solder dot which has been placed upon the deposited layer. The ultimate result achieved is the formation of a very small area junction but with minimum stalk. This junction may be either between the different material and the bulk or in the different material immediately beneath the solder dot. In either case, a strong mechanical connection accompanies the desired junction.

The foregoing and other objects, features and advantages of the invention will be apparent from the following more particular description of a preferred embodiment of the invention, as illustrated in the accompanying drawing.

FIGURES 1–4 illustrate the stages of fabricating a semiconductor device in accordance with the technique of the present invention.

Referring now to FIGURE 1, there is illustrated a semiconductor device 1 having two regions formed by depositing a layer of semiconductor material 2, for example, gallium arsenide, onto a substrate 3 of germanium. The deposition is preferably achieved in accordance with the process described in G. A. Silvey patent application Ser. No. 59,004, filed Sep. 28, 1960, which involves a halide disproportionation reaction whereby semiconductor material is deposited on a substrate by decomposition of a halide compound containing the semiconductor material. The deposition may be carried on until a layer on the order of $\frac{1}{10}$ of a mil in thickness is obtained. With suitably chosen materials, a junction 4 will exist between the thin layer 2 and the substrate 3. This junction may or may not be the electrically significant one in the operation of the device.

Figure 2:
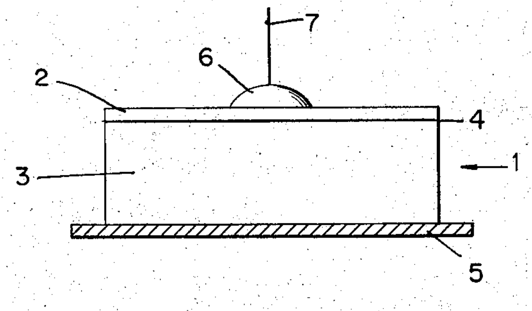

FIGURE 2 shows the second stage in the technique of the present invention whereby an ohmic contact 5 is made to the bottom surface of the germanium body. A dot of solder 6 is placed upon the deposited layer 2. If desired, the dot of solder 6 may serve as an ohmic contact to the deposited layer 2, or it may form an alloy junction with the deposited layer 2. A wire 7 may be included in making the contact to the body for circuit connecting purposes.

Figure 3:
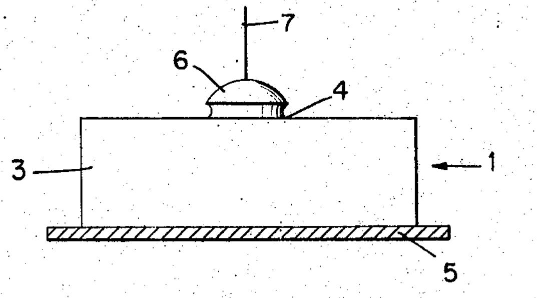

FIGURE 3 illustrates the result obtained after the etching has proceeded for a limited time. By using an etchant such as $CP_4$, containing acetic acid, hydrofluoric acid, concentrated nitric acid and liquid bromine, which is effective in attacking the deposited layer 2 but is much less, or not at all, effective to dissolve the substrate 3, only the deposited layer will be significantly eaten away. The solder dot 6 is, of course, chosen to be etch resistant.

Figure 4:
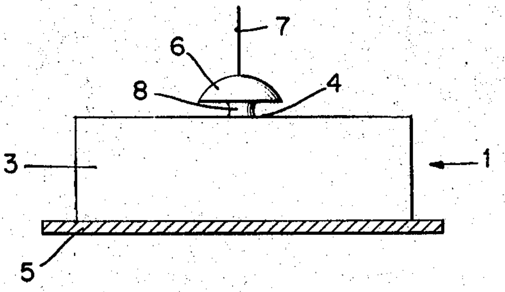

The etching treatment is allowed to continue beyond the stage shown in FIGURE 3 with the result that the etchant begins to dissolve the portion of the deposited layer 6 underlying the solder dot 2. There is thus obtained, as illustrated in the embodiment of FIGURE 4, a semiconductor device having a junction 4 of extremely small area, on the order of $\frac{3}{10}$ of a mil or less in diameter, but with a short projection 8, that is, on the order of $\frac{1}{10}$ of a mil.

In the alternative, the etch-resistant dot 6 may be made, not of solder, but of some other material which can be removed after etching. For example, an organic photo-resist of known type may be used. After etching, the resist may be removed and a connection may then be made directly to the minute disc 8 projecting above the substrate by pressing a metal electrode against it. As a further modification, the whole deposited layer 2 may be covered by an additional deposited layer of a metal, which does not resist the etchant, before the etch-resistant dot is applied. After processing, a pressure electrode would then make contact with the layer of metal rather than directly with the disc.

It will be appreciated that the specific embodiment which has been illustrated in its several stages by FIGURES 1–4 is merely indicative of the principles of the present invention and that, although the description has been furnished in connection with the fabrication of a single junction device, the principle is likewise applicable to the formation of plural junction devices.

It will be understood that, although the technique of the present invention has been described above in connection with the employment of the semiconductor materials, germanium and gallium arsenide, and in particular with reference to the specific formation of a thin layer of gallium arsenide on a substrate of germanium, other combinations of semiconductor materials can also be utilized. As another example, referring back to FIGURES 1–4, the technique may be practiced employing a substrate 1 of silicon. A thin layer 2 of germanium is grown by a conventional vapor growth process so as to form a heterocrystalline structure. Then by a suitable etchant, namely, hydrogen peroxide, the thin germanium layer 2 is dissolved except for the portion which is protected by the applied etch-resistant dot 6 with the eventual result, as depicted in FIGURE 4, of very small area junction and with a short projection 8 above the substrate 3.

As is apparent, the technique of the present invention is generally adapted to precision formation of the vertical and lateral dimensions of a very tiny device. By providing that a heterocrystalline interface govern the first boundary of the vertical dimension of the device and by the controlled use of a preferential etchant which is capable of dissolving the crystalline material bounded by the interface, a very high degree of control is established in the formation of such devices as injection lasers and arrays of integrated circuit elements.

While the invention has been particularly shown and described with reference to a preferred embodiment thereof, it will be understood by those skilled in the art that various changes in form and detail may be made therein without departing from the spirit and scope of the invention.

What is claimed is:

1. A method of making semiconductor devices including the fabrication of a semiconductor junction of small area comprising, depositing at least one thin layer of first semiconductor material having a first band gap upon a substrate of second semiconductor material having a second band gap to form a junction therebetween, applying a dot of etch-resistant material to cover a portion of said one thin layer, etching the entire structure thus formed with an etchant effective to dissolve substantially only said first semiconductor material such as to remove all of said one thin layer from said substrate except for that portion underlying said dot of etch-resistant material, and continuing said last-mentioned step to purposefully dissolve said underlying portion of said one thin layer except for a small part thereof defining said small area junction with said substrate.

2. A method of making semiconductor devices as defined in claim 1, including the further steps of removing said dot of etch-resistant material from over said small area portion, and forming an ohmic contact to said small area portion.

3. A method of forming semiconductor devices as defined in claim 1, including the further step of forming said dot of etch-resistant material of a solder dot defining an ohmic contact with said one thin layer.

4. A method of forming semiconductor devices as defined in claim 1, including the further step of forming said dot of etch-resistant material of a solder dot defining an alloy junction with said one thin layer.

5. A method of making semiconductor devices including the fabrication of a semiconductor junction of small area comprising, depositing a thin layer of gallium arsenide upon a substrate formed of germanium, applying a dot of etch-resistant material to cover a portion of said thin layer of gallium arsenide, etching the entire structure thus formed with an etchant effective to dissolve substantially only said thin layer of gallium arsenide so that said thin layer of gallium arsenide is removed from said substrate except for that portion underlying said dot of etch-resistant material, and continuing said last-mentioned step to purposefully dissolve said underlying portion of said thin layer of gallium arsenide except for a small part thereof defining said small area junction with said substrate.

6. A method of making semiconductor devices including the fabrication of a semiconductor junction of small area comprising, depositing a thin layer of germanium upon a substrate formed of silicon, applying a dot of etch-resistant material to cover a portion of said thin layer of germanium, etching the entire structure thus formed with an etchant effective to dissolve substantially only said thin layer of germanium so that said thin layer of germanium is removed except for that small portion underlying said dot of etch-resistant material, and continuing said last-mentioned step to purposefully dissolve said underlying portion of said thin layer of germanium except for a small part thereof defining said small area junction with said substrate formed of silicon.

References Cited by the Examiner

UNITED STATES PATENTS

| | | | |
|---|---|---|---|
| 2,731,333 | 1/1956 | Ko et al. | 156—3 |
| 2,846,340 | 8/1958 | Jenny | 156—17 X |
| 2,871,110 | 1/1959 | Stead | 156—17 X |
| 2,878,147 | 3/1959 | Beale | 156—17 X |
| 3,110,849 | 11/1963 | Soltys | 156—17 X |

ALEXANDER WYMAN, *Primary Examiner.*

JACOB STEINBERG, *Examiner.*